(12) United States Patent
Willer et al.

(10) Patent No.: US 7,796,449 B2
(45) Date of Patent: Sep. 14, 2010

(54) INTEGRATED CIRCUIT, METHOD TO PROGRAM A MEMORY CELL ARRAY OF AN INTEGRATED CIRCUIT, AND MEMORY MODULE

(75) Inventors: Josef Willer, Riemerling (DE); Gert Koebernik, Unterhaching (DE)

(73) Assignee: Qimonda AG, Munich (DE)

( * ) Notice: Subject to any disclaimer, the term of this patent is extended or adjusted under 35 U.S.C. 154(b) by 108 days.

(21) Appl. No.: 12/351,023

(22) Filed: Jan. 9, 2009

(65) Prior Publication Data

US 2009/0201740 A1 Aug. 13, 2009

(30) Foreign Application Priority Data

Jan. 9, 2008 (DE) .................. 10 2008 003 637

(51) Int. Cl.
*G11C 7/00* (2006.01)
(52) U.S. Cl. .................. 365/189.16; 365/185.18
(58) Field of Classification Search ............ 365/189.16, 365/185.18
See application file for complete search history.

(56) References Cited

U.S. PATENT DOCUMENTS

| 5,867,429 A * | 2/1999 | Chen et al. ............. 365/185.33 |
| 5,930,167 A | 7/1999 | Lee et al. |
| 6,898,121 B2 * | 5/2005 | Chien et al. ............ 365/185.17 |
| 7,075,823 B2 * | 7/2006 | Harari .................... 365/185.17 |
| 7,672,171 B2 * | 3/2010 | Forbes et al. ........... 365/185.28 |
| 2004/0165443 A1 * | 8/2004 | Harari .................... 365/185.18 |
| 2007/0297245 A1 | 12/2007 | Mokhlesi |
| 2008/0205147 A1 * | 8/2008 | Santin et al. ........... 365/185.17 |

* cited by examiner

*Primary Examiner*—Tuan T. Nguyen

(57) ABSTRACT

An integrated circuit having a memory cell arrangement with a plurality of memory cells and a memory cell arrangement controller is provided. The memory cell arrangement controller is configured such that during programming of at least one memory cell of the plurality of memory cells, at least one memory cell, which is arranged adjacent to the memory cell to be programmed, is driven to shield the memory cell to be programmed.

26 Claims, 6 Drawing Sheets

INTEGRATED CIRCUIT, METHOD TO PROGRAM A MEMORY CELL ARRAY OF AN INTEGRATED CIRCUIT, AND MEMORY MODULE

RELATED APPLICATIONS

This application claims priority to German Patent Application Serial No. 10 2008 003 637.4, which was filed Jan. 9, 2008, and is incorporated herein by reference in its entirety.

TECHNICAL FIELD

Embodiments of the invention relate generally to an integrated circuit, a method for programming a memory cell array of an integrated circuit and a memory module.

BACKGROUND

A memory system usually includes a memory array with a plurality of flash-EEPROM (Electrically Erasable Programmable Read Only Memory) memory cells.

In such a usual memory system it is possible that in a first operation mode the flash EEPROM memory cells are programmed in such a way that only one bit is stored at each of the flash EEPROM memory cells, what means that the memory cell array is working like a cash memory. Later on using background operation of the memory system the stored data will be read again and will be written into with the flash EEPROM memory cells, but this time using a second operating mode for storing a plurality of bits to the respective flash EEPROM memory cells.

With the usual method for storing of a logic state using a ferro-electrical transistor of a storage cell of a memory array there is at least a second ferro-electrical transistor of the memory array controlled in such a way that it is operating in depletion mode.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
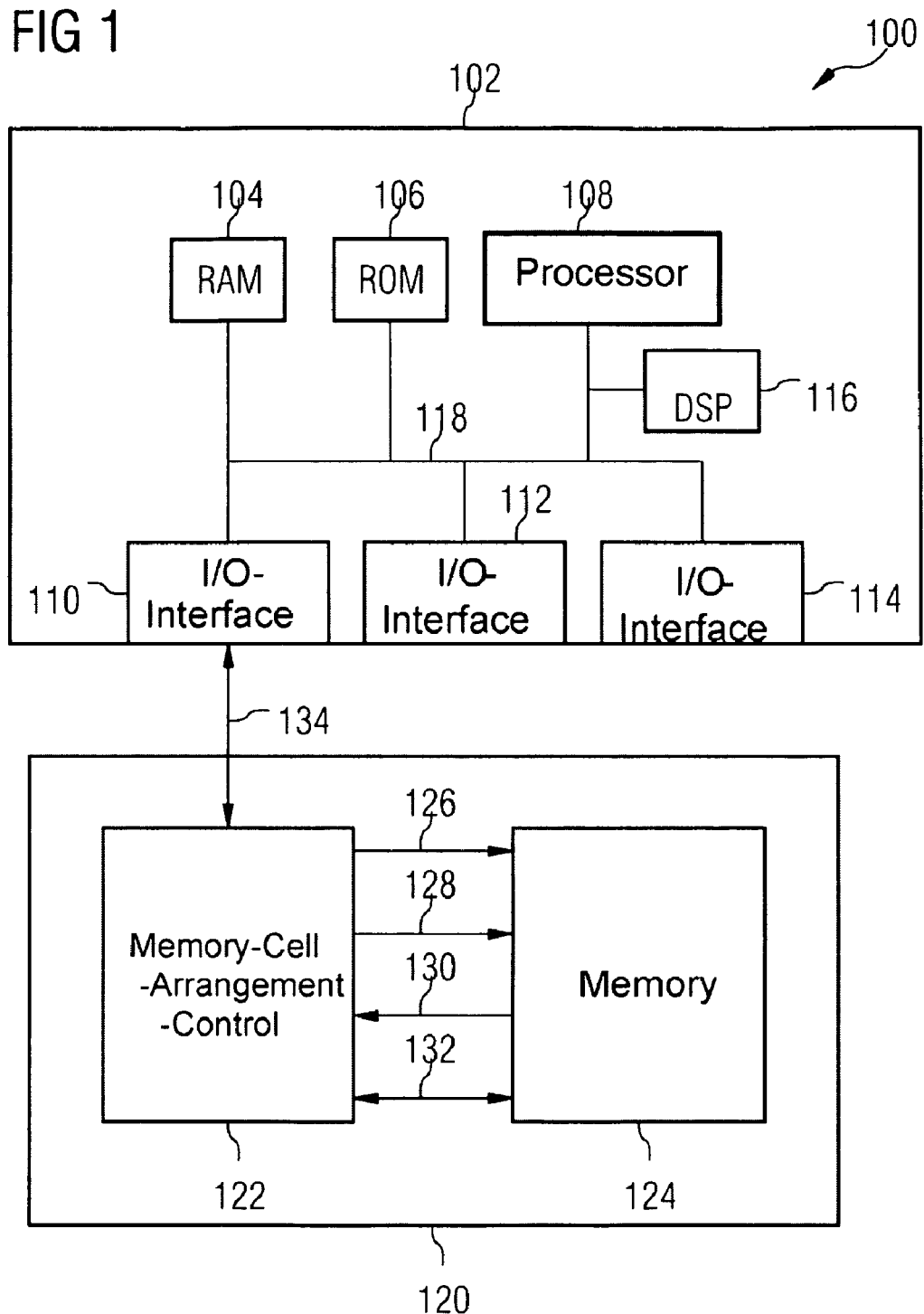
FIG. 1 shows a computer system with a memory cell arrangement according to an embodiment of the invention.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Within the scope of this specification the terms "connected" and "coupled" are used to characterize direct as well as indirect connection and also direct and indirect coupling.

Embodiments of the invention provide a fast storage of information to the memory array adaptable to the application.

Further embodiments of the invention provide an integrated circuit with a memory cell arrangement. The memory cell arrangement may include a memory cell array with a plurality of memory cells and a memory cell arrangement controller, which is configured in such a way that in a first operation mode of the programming of at least one memory cell of the plurality of memory cells, at least one memory cell which is adjacent to the memory cell to be programmed is driven for shielding of the at least one memory cell to be programmed, and in a second operating mode of programming of at least one memory cell of the plurality of memory cells at least one memory cell adjacent to the memory cell to be programmed is not driven to shield the memory cell to be programmed.

Further embodiments of the invention provide a method for programming a memory cell arrangement of an integrated circuit. The memory cell arrangement may include a memory cell array with a plurality of memory cells. According to the method in a first programming mode at least one memory cell of the plurality of memory cells is programmed, and at least one memory cell, which is arranged adjacent to the memory cell to be programmed is driven to shield the at least one memory cell to be programmed, and in a second programming mode at least one memory cell of the plurality of memory cells is programmed, and at least one memory cell adjacent to the memory cell to be programmed is not driven to shield the memory cell to be programmed.

According to another embodiment of the invention a memory module is provided having a plurality of integrated circuits whereas at least one integrated circuit of the plurality of integrated circuits includes a memory cell arrangement, and the memory cell arrangement includes a memory array having a plurality of memory cells and a memory cell arrangement controller. The memory cell arrangement controller is configured such that in a first programming mode during programming of at least one memory cell of the plurality of memory cells, at least one memory cell which is adjacent to the memory cell to be programmed is driven to shield the at least one memory cell to be programmed, and in a second programming mode during programming of at least one memory cell of the plurality of memory cells at least one memory cell adjacent to the memory cell to be programmed is not driven to shield the memory cell to be programmed.

The described variants of the embodiments of the invention hold true correspondingly for the integrated circuit and for the method for programming of a memory cell arrangement of an integrated circuit and the memory module.

For the second programming mode it may be intended that none of adjacent memory cell of the memory cells to be programmed are driven to shield the memory cells to be programmed during programming of at least one memory cell of a plurality of memory cells.

The at least one memory cell to be programmed may be coupled to a first control line and the at least one memory cell, which is adjacent the memory cell to be programmed is coupled to a second control line, which is at least partially adjacent to the first control line.

According to a further embodiment of the invention a control terminal of the at least one memory cell to be programmed may be electrically coupled to the first control line and the control terminal of the at least one memory cell which is adjacent to the memory cell to be programmed may be electrically coupled to the second control line.

The first control line may be a first word line and the second control line may be a second word line, which is adjacent to the first word line.

The memory cells in the memory cell array may be arranged in form of a matrix with rows and columns or may be configured in zigzag form.

According to further embodiments of the invention the memory cells are non volatile memory cells.

A "non volatile memory cell" may be a memory cell, which stores data even when not active. According to an embodiment of the invention a memory cell can be defined as not active, if there is actually no access to the content of the memory cell. According to another embodiment of the invention a memory cell is not active if the power supply is not active. Despite this, the stored data may be refreshed periodically but not like a volatile memory cell every some picoseconds or nanoseconds or milliseconds but more in the range of hours, days, weeks or month. Alternatively, some embodiments do not need a refresh of the data at all.

Non volatile memory cells may be memory cells selected from a group of memory cells consisting of:
- ferroelectric random access memory, FeRAM, FRAM,
- magnetoresistive random access memory, MRAM;
- phase change random access memory, PCRAM, e.g. Ovonic Unified Memory(OUM)-memory cells;
- chalcogenide random access memory, C-RAM;
- conductive bridging random access memory, CBRAM, or programmable metallization cell, PMC;
- organic random access memory, ORAM;
- nanotube random access memory, NRAM.

Alternative embodiments of the invention may use other kind of non volatile memory cells.

The memory cells of other embodiments of the invention have resistive memory cells.

Further the memory cells may be electrically erasable programmable read only memory cells (EEPROM).

The memory cells of another embodiment of the invention are flash memory cells, e.g. charge storage memory cells as e.g. floating gate memory cells or charge trapping memory cells.

Charge trapping memory cells may have a charge trapping layer structure for trapping of electrical charge carriers, whereas the charge trapping layer structure at least has two separated charge trapping regions. In accordance with an embodiment of the invention, the charge trapping structure has a dielectric layer, which is formed by a material from the group of: silicon nitride ($Si_3N_4$), aluminum oxide ($Al_2O_3$), hafnium oxide ($HfO_2$), zirconium oxide ($ZrO_2$), yttrium oxide ($Y_2O_3$), lanthanum oxide ($LaO_2$), amorphous silicon, tantalum oxide ($Ta_2O_5$), titanium oxide ($TiO_2$) and an aluminate. An example for aluminate is an alloy from aluminum, zirconium and oxygen (AlZrO). The charge trapping layer structure of an alternative embodiment of the invention shows one, two, three, four or even more dielectric layers, which are arranged one above the other. Further, the charge trapping layer structure of an alternative embodiment of the invention has a nitride oxide layer structure, forming an ONO structure together with the gate isolation layer, which may be formed by an oxide.

The memory cell arrangement controller may be configured in such a way that for the shielding of the at least one memory cell to be programmed an electrical potential is provided to the memory cell, which is arranged adjacent to the memory cell to be programmed. In respect to an embodiment this electrical potential may be essentially zero volts. Alternatively, for another embodiment, the electrical potential is an electrical potential, whose polarity is opposite to the potential used to program the at least one memory cell to be programmed.

Further, the memory cell array of the memory cell arrangement may include at least one additional memory cell, which is arranged adjacent to the memory cell to be programmed. The at least one additional memory cell may be electrically coupled to a third control line, which is at least partially arranged adjacent to the first control line and at least partially arranged on the opposite side of the first control line in respect to the second control line. In this case, the memory cell arrangement controller may be built in such a way, that the at least one additional memory cell is driven for shielding the at least one memory cell to be programmed.

According to an embodiment of the invention, the memory cell arrangement controller is configured in such a way, that the programming is carried out according to the second programming mode, by the time no external programming request is executed by the memory cell arrangement. In this case, the second programming mode represents e.g. a background control mode, i.e. in other words in respect to this embodiment e.g. in a first programming mode the memory cells may be programmed fast but with a small storage density and later, if there is no external write operation, read operation or erase operation to be executed and such seen from the user side is not active (stand-by mode) via the first operation mode stored data are read from the storage cells and according to the second programming mode written to the memory cell array, which may e.g. be done with a higher storage density (e.g. a higher number of bits per memory cell compared to the first program mode). Hence, according to an embodiment of the invention, there may be provided high density storage of data which is not recognizable for the user. The user would in this case only realize a very fast storage of data according to the first programming mode, thus improving the usability.

The memory cell arrangement controller may according to an embodiment of the invention be configured in such a way that the programming according to the second programming mode is carried out if a prior defined criterion is fulfilled.

The pre-defined criterion may be a default filling level of the memory cell array. In such a case the memory cell arrangement controller may be configured in such a way that the programming according to the second programming mode is carried out if the filling level of the memory cell array is higher than a pre-defined filling level. Alternatively, the memory cell arrangement controller may be configured in such a way that the memory cell array is programmed in accordance with the second programming mode with higher memory storage density as using the first programming mode. Further, the memory cell arrangement controller may be configured in such a way that the memory cells of the memory cell array according to the second programming mode are programmed with more program-voltage pulses and/or with programming voltage pulses of longer duration (e.g. with less voltage) and/or with programming voltage pulses with less voltage as according to the first programming mode. The programming may be specially at least during the last phase (e.g. during the last one, two, three, four, or five program voltage pulses) carried out with smaller or even increasingly smaller increments of the threshold voltage trim, particularly threshold voltage increase into the direction of the target value of the threshold voltage.

The memory module is according to an embodiment a stackable memory module, wherein at least some of the integrated circuits are stacked one above the other.

FIG. 1 shows a computer system 100 with a computer arrangement 102 and a memory cell arrangement 120 in accordance with an embodiment of the invention.

The computer arrangement 102 may be configured as (or the computer arrangement may include) a device having a processor, e.g. a programmable processor as e.g. a microprocessor (e.g. a CISC (complex instruction set computer) microprocessor or a RISC (reduced instruction set computer) microprocessor. According to several embodiments of the invention, the computer arrangement 102 is e.g. configured as (alternatively the computer arrangement includes) a personal computer, a work station, a personal digital assistant (PDA), a wireless telephone (cordless phone or mobile phone), a camera (e.g. an analog camera or digital camera) or another device having a processor (e.g. a household appliance (e.g. a washing machine, a dish washer etc.)).

The computer arrangement 102 includes in an embodiment of the invention one or more computer arrangement-internal random access memories 104, e.g. a dynamic random access memory, in which e.g. the data to be processed can be stored. Further, the computer arrangement 102 may have one or more computer arrangement-internal read only memories (ROM) 106, in which e.g. the executable program code of a processor 108 is stored and the processor 108 (e.g. a processor as described above) is also part of the computer arrangement 102.

A computer arrangement 102 may include as an embodiment of the invention one or a plurality of input/output interfaces 110, 112, 114 (in FIG. 1 three input/output interfaces are shown, for alternative embodiments of the invention there may be one, two, four or even more than four input/output interfaces) for connection of one or more computer arrangement external arrangements (as e.g. additional memories one or more communication devices, one or more additional processors etc.) to the computer arrangement 102.

The input/output interface 110, 112, 114 may be configured as analog interfaces and/or as digital interfaces. The input/output interface 110, 112, 114 may be configured as serial interfaces and/or as digital interfaces. The input/outputs interface 110, 112, 114 may be implemented as one or more circuitries, which realize a respective communication protocol stack within their functionality fitting to the communication protocol used for data transfer. Each of the input/output interfaces 110, 112, 114 may be implemented to any communication protocol. According to an embodiment of the invention, each of the input/output interfaces 110, 112, 114 may be implemented according to one of the following communication protocols:

an adhoc-communication protocol as e.g. fire-wire or Bluetooth;

a communication protocol for serial data transfer as e.g. RS-232, universal serial bus (USB) (e.g. USB 1.0, USB 1.1, USB 2.0, USB 3.0);

any other communication protocol as e.g. IrDA (infrared data association).

According to an embodiment of the invention, the first input/output interface 110 is a USB interface (for alternative embodiments of the invention, it may be configured according to any other communication protocol, e.g. as described above).

Further according to an embodiment of the invention, the computer arrangement 102 optionally shows an additional digital signal processor (DSP) 116 which may be used for digital signal processing. Further, the computer arrangement 102 may have additional communication modules (not shown here) as e.g. one or a plurality of senders, one or a plurality of receivers, one or a plurality of antennas, etc.

The computer arrangement 102 may include further components (not shown here), which are necessary or desirable for the particular application.

Some or all circuitries or components of the computer arrangement 102 may according to an embodiment of the invention be connected to each other by means of one or a plurality of computer arrangement-internal connections 118 (e.g by means of one or more computer busses) to transfer data and/or control signals between the respective connected circuitries or components.

Further, the computer system 100 may have a memory cell arrangement 120 in accordance with an embodiment of the invention.

The memory cell arrangement 120 may in accordance with an embodiment of the invention be implemented as an integrated circuit. The memory cell arrangement 120 may further be implemented in a memory module with a plurality of integrated circuitries, wherein at least one integrated circuit of the plurality of integrated circuits includes a memory cell arrangement 120, as will be described in more detail below. The memory module may be a stackable memory module, wherein at least some of the integrated circuitries are stacked above each other. In accordance with an embodiment of the invention, the memory cell arrangement 120 is implemented in form of a memory card.

According to an embodiment of the invention, the memory cell arrangement 120 may show a memory cell arrangement controller 122 (e.g. implemented by means of hard wired logic and/or by means of one or multiple processors, e.g. by means of one or a plurality of programmable processors as e.g. one or a plurality of microprocessors (e.g. CISC (complex instruction set computer) microprocessor(s) or RISC (reduced instruction set computer) microprocessor(s).

The memory cell arrangement 120 may further have a memory 124 with a plurality of memory cells. The memory 124 will be described in more detail below.

According to an embodiment of the invention, the memory cell arrangement controller 122 may be connected by means of different connections with the memory 124. Each of the connections may have one or a plurality of connection lines resulting in e.g. a band width of one or more bits. Thus, e.g. an address bus 126 may be implemented by means of which one or several addresses of one or several memory cells is provided to the memory 124 by the memory cell arrangement controller 122, on which an operation (e.g. an erase operation, a write operation, a read operation, an erase verify operation or a write verify operation etc) may be carried out. Furthermore, a data write connection 128 may be implemented by means of which the information to be written to the particular addressed memory cell may be supplied by the memory cell arrangement controller 122 to the memory 124. Further, a data read connection 130 may be implemented, by means of which the stored information of the respective addressed memory cell can be read from the memory 124 and fed to the memory cell arrangement controller 122 and by this means fed to e.g. the computer arrangement 102 or alternatively fed directly to the computer arrangement 102 (in which case the first input/output interface 110 is connected directly with memory 124). With the help of a bidirectional control/state connection 132 the memory 124 may be fed with control signals from the memory cell arrangement controller 122 or state signals, which represent the logic state of the memory 124, may be fed from the memory 124 to the memory cell arrangement controller 122.

According to an embodiment of the invention, the memory cell arrangement controller 122 is connected with the first input/output interface 110 by means of a communication connection 134 (e.g. a USB communication connection).

In an embodiment of the invention, the memory 124 includes a chip or a plurality of chips. Further the memory cell arrangement controller 122 may be realized on the same chip as the components of the memory 124 or on a separate chip.

Figure 2:
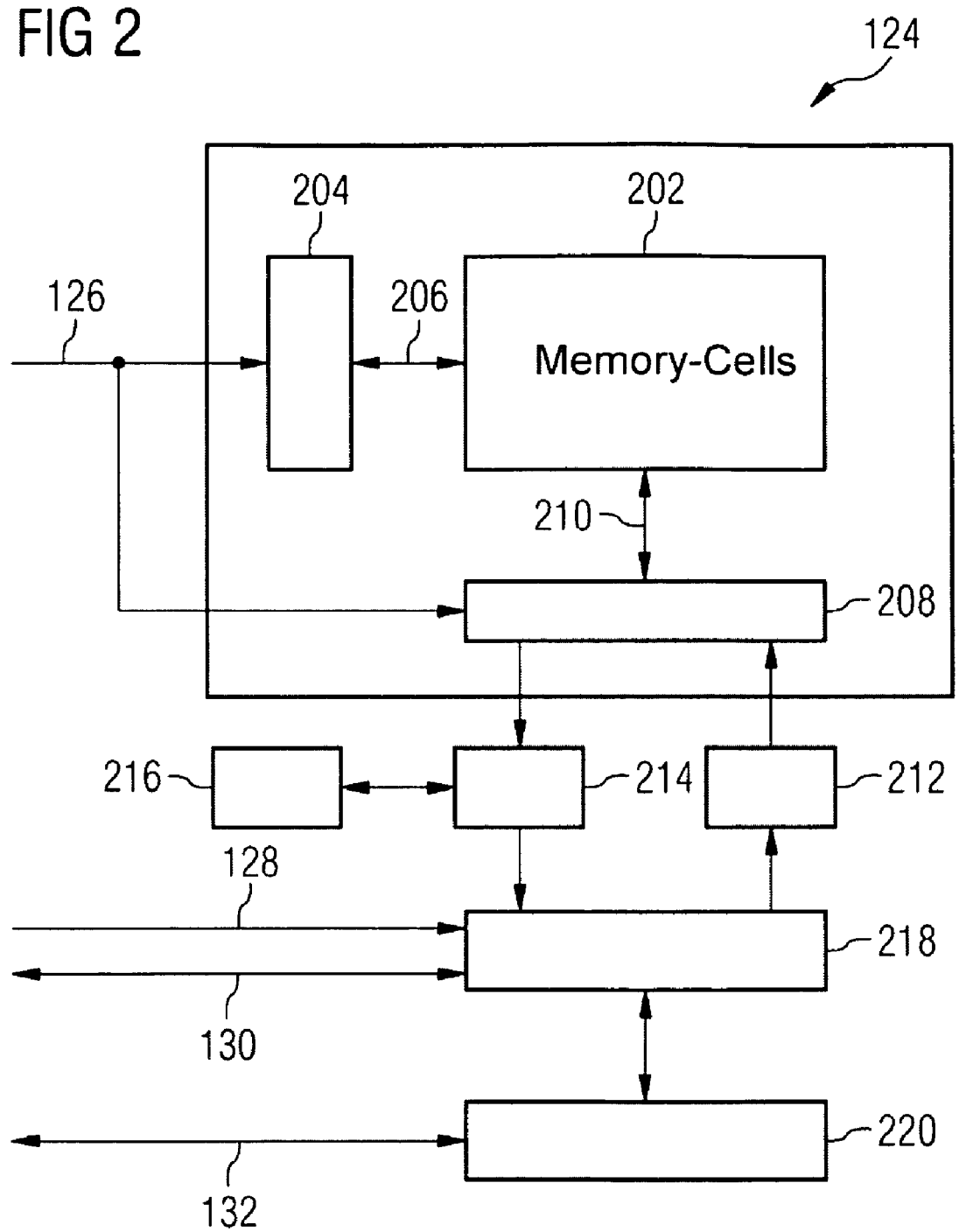
FIG. 2 shows a memory cell array according to an embodiment of the invention corresponding to the embodiment of the invention from FIG. 1 in more detail.

FIG. 2 shows a memory 124 according to an embodiment of the invention in more detail.

According to an embodiment of the invention, the memory 124 includes a memory cell array 202 with a plurality of memory cells. The memory cells may be arranged in the memory cell array 202 in form of a matrix in rows and columns or alternatively e.g. in form of a zigzag. Other embodiments may arrange the memory cells in an arbitrary manner in the memory cell array 202.

Generally, each memory cell is e.g. connected at least with a first control line (e.g. a word line) as well as a second control line (e.g. a bit line).

According to an embodiment where the memory cells of the memory cell array 202 are arranged in form of a matrix in rows and columns, there may be a row decoding circuitry 204 to select at least one row control line (e.g. a word line) of a plurality of row control lines 206 in a memory cell array 202 as well as a column decoder circuitry 208 to select at least one column control line (e.g. a bit line) of a plurality of column control lines 210 within the memory cell array 202.

In accordance with an embodiment of the invention, the row decoder circuitry 204 and the column decoder circuitry 208, by which at least one memory cell is uniquely identified, are fed with address signals necessary for an access operation (e.g. one of the operations described above) by means of the address bus 126, which is connected with those. The row decoder circuitry 204 selects at least one cell and though it selects at least one row control line 206 according to the supplied address signal. Furthermore, the row decoder circuitry 208 selects at least one row and therewith at least one row control line 210 according to the supplied address signal.

The electrical voltages designated for the selected operation like reading, programming (e.g. writing), or erasing of one or more memory cells are applied to the at least one selected row control line 206 and to the at least one selected column control line 210.

In case each memory cell is constructed in form of a field effect transistor (e.g. as charge storing memory cell) according to an embodiment of the invention, the gate terminal is connected with the row control line 206 and a first source drain terminal is connected with a first column control line 210. A second source drain terminal may be connected with a second column control line 210, alternatively with a first source drain terminal of an adjacent memory cell, which then may be e.g. also connected with the same row control line 206 (this is the case e.g. for a NAND arrangement of the memory cells of the memory cell array 202).

According to an embodiment of the invention, for reading or programming at the same time respectively a single row control line 206 and a single column control line 210 are selected and suitably accessed to read or program respectively the memory cell thus selected. According to an alternative embodiment of the invention, it may be configured that for reading or for programming at the same time respectively only one row control line 206 and several column control lines 210 are selected, whereby several memory cells may be read or programmed, respectively.

Further in accordance with an embodiment of the invention, the memory 124 has at least one write buffer memory 212 and at least one read buffer memory 214. The at least one write buffer memory 212 and the at least one read buffer memory 214 are connected with the column decoder circuitry 208. Depending on the memory cell type reference memory cells 216 may be provided.

For programming (e.g. writing of) a memory cell the data to be programmed are received by means of a data write connection 128 from a data register 218, which is connected to the data write connection 128 and buffered during the write operation within the at least one write buffer memory 212.

For reading of a memory cell the read data stored in the addressed memory cells (represented e.g. by the electrical current, which is flowing through the addressed memory cell and the respectively column control line 210, which is compared to a current threshold value, which may e.g. be dependent on the reference cells 216, for gathering of the content of the memory cell) are buffered in the read buffer memory 214 during the read operation. The comparison result and hence the logic state of the memory cell (whereas the logic state of the memory cell represents the memory content of the memory cell) is stored in the data register 218 and provided by means of the data read connection 130, which is coupled to the data register 218.

The access operations (e.g. write operation, read operation or erase operation) are controlled by a memory internal control logic 220, which itself is controlled by the memory cell arrangement controller 122 by means of a bidirectional control/state connection 132.

In accordance with an embodiment of the invention, the memory cells of the memory cell array are grouped in memory blocks or memory sectors, which e.g. are erased together in an erase operation. In an embodiment of the invention, within one memory block or memory sector so many memory cells are included, that e.g. the same amount of data may be stored as in an conventional solid state disc sector (e.g. 512 Byte), although alternatively a memory block or a memory sector may store a different amount of data.

Further the memory 124 may include other conventional memory components (e.g. charge pump circuitries etc.), which are not shown in FIG. 1 and FIG. 2 in respect to clarity.

Figure 3:
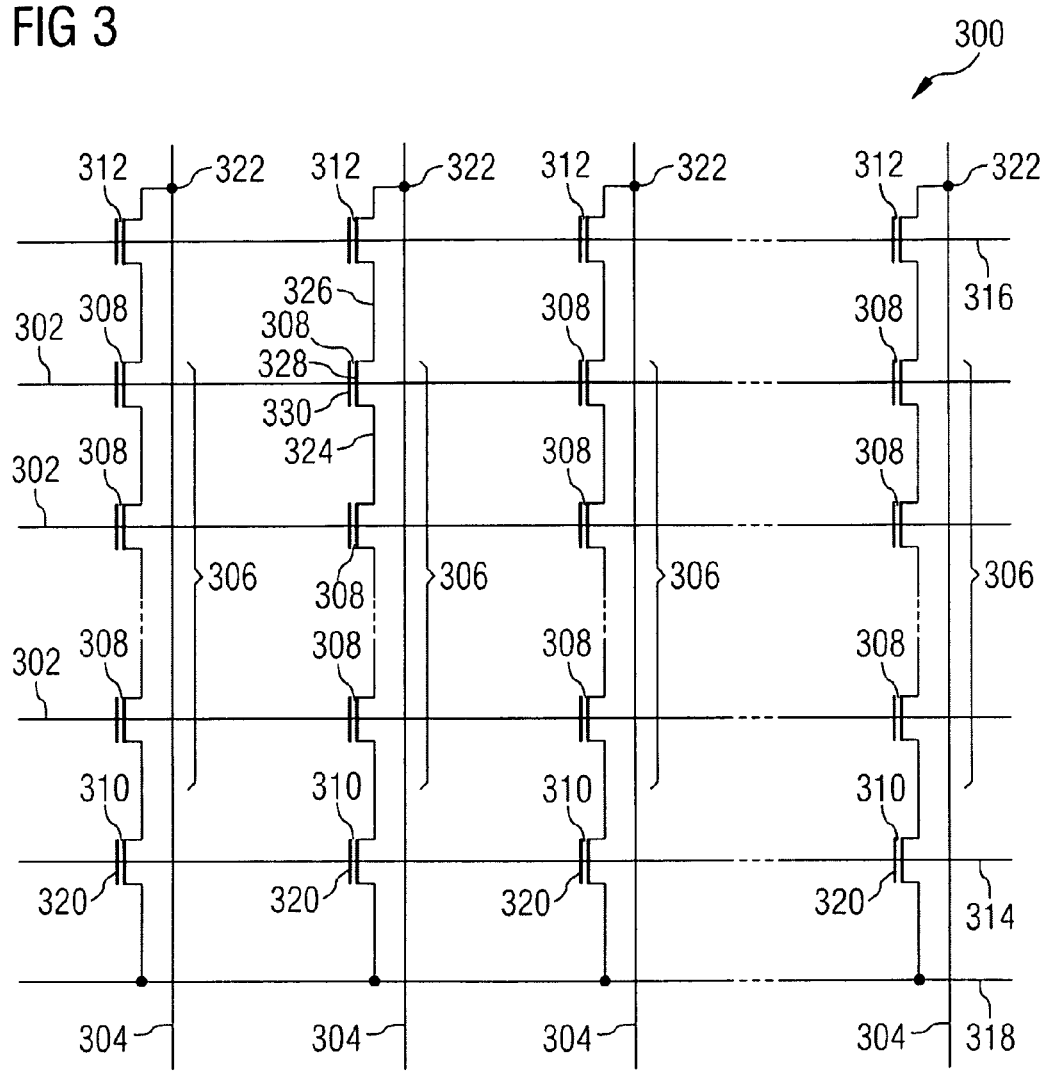
FIG. 3 shows a memory cell arrangement of the memory cell array from FIG. 2 according to an embodiment of the invention.

FIG. 3 shows a memory cell arrangement 300 of the memory cell array 202 according to an embodiment of the invention.

According to an embodiment of the invention, the memory cell arrangement 300 is arranged in form of an NAND memory cell array (notwithstanding other connection architecture may be by implication provided for an alternative embodiment). The NAND memory cell array 300 exhibits a word line 302 (e.g. the row control line 206), wherein generally an arbitrary number of word lines 302 may be provided, e.g. within an embodiment 1024 word lines 302 are provided, as well as the bit lines 304 (e.g. the column control lines 210) crossing the word lines 302, wherein generally an arbitrary number of bit lines 304 may be provided, e.g. 512 bit lines 304 are provided according to an embodiment.

The NAND memory cell array 300 further exhibits in respect to an embodiment of the invention NAND stings 306, wherein each NAND string 306 provides a plurality of memory cells, e.g. a plurality of charge storing memory cells 308 (e.g. transistor type of floating gate memory cells or charge trapping memory cells). Further, according to an embodiment of the invention, an arbitrary number of memory cells 308 may be included in each NAND string 306, e.g. 32 memory cells 308, 64 memory cells 308, 128 memory cells 308, etc. The memory cells 308 may be coupled to each other in series source to drain between a source select gate 310, which may be realized as field effect transistor, and a drain select gate, which may also be realized as field effect transistor. Each source select gate 310 is arranged at a cross point of a bit line 304 and a source select line 314. Each drain select gate 312 is arranged at a cross point of a bit line 304 and a drain select line 316. The drain of each source select gate 310 is connected with a source terminal of the first memory cell 308 of the respective NAND string 306. The source of each source select gate 310 is connected to a common source line 318. A source gate 320 of each source select gate 310 is connected to the source select line 314.

According to an embodiment of the invention, the common source line 318 is coupled between the source select gates 310 for NAND strings 306 of two different NAND arrays. Hence, two NAND arrays are sharing the common source line 318.

In an embodiment of the invention, the drain of each drain select gate 312 is connected to the bit line 304 of the respective NAND string 306 at a drain terminal 322. The source of each drain select gate 312 is connected with the drain of the last memory cell 308 of the respective NAND string 306. For an embodiment of the invention, the two NAND strings 306 are sharing the same drain terminal 322.

For an embodiment of the invention, each memory cell 308 has a source 324 (e.g. a first source/drain region), a drain 326 (e.g. a second source/drain region), a charge storage region 328 (e.g. a floating gate region or a charge trapping region (e.g. a dielectric layer stack)), and a control gate 330. The control gate 330 of each memory cell 308 is connected with the respective word line 302. A column of the NAND memory cell arrays 300 includes a respective NAND string 306 and a row of the NAND memory cell array 300 includes those memory cells 308, which are connected with the respective word line 302.

In an alternative embodiment of the invention, the memory cell array 300 is a NOR memory cell array 300. In a further embodiment of the invention, the memory cell array 300 is arranged in an arbitrary other appropriate architecture.

Figure 4:
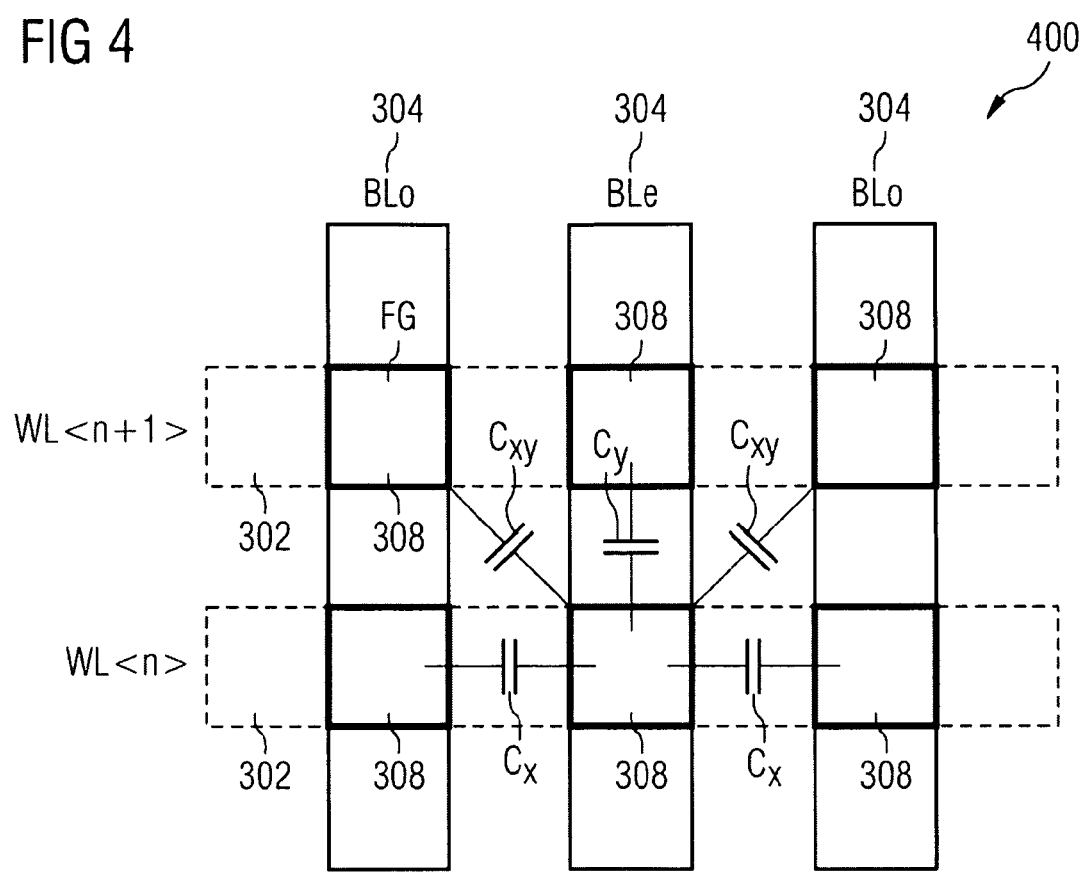
FIG. 4 shows a cutout of the memory cell arrangement of FIG. 3 according to an embodiment of the invention.

FIG. 4 shows a cutaway 400 of the memory cell arrangement 300 of FIG. 3 in respect to an embodiment of the invention in more detail.

As shown in FIG. 4, there are e.g. at floating gate memory cells 308 interferences between the floating gate regions of adjacent floating gate memory cells 308, which is symbolized in FIG. 4 via a first coupling constant Cx (for capacitive coupling between adjacent arranged floating gate memory cells 308 along the same bit line 304, which are coupled with an adjacent word line 302 and an adjacent bit line 304).

These interferences may be caused by electrical fields, which according to electrostatic rules arise between adjacent memory structures. They become as stronger as closer the memory cells move to each other, when the structure size become smaller. Hence, this phenomenon appears to an increasing degree with the nowadays usual structure size of 50 nm and smaller.

These interferences cause a spreading of the threshold voltage distribution of the floating gate memory cells 308 in a memory cell array 300, wherein the second coupling capacity Cy takes the highest value.

Usually, a plurality of voltage pulses are needed in the course of a write operation, to get to a sufficiently small threshold voltage distribution of floating gate memory cells 308 in a memory cell array 300. This leads to a relatively slow speed of programming (e.g. typically in the range of about 1 Mbyte/s). This phenomenon already arises with single level memory cells, but it gains even higher importance with multi level memory cells.

In the course of this specification the understanding of multi level memory cell is e.g. a memory cell, which is configured to store a plurality of bits by means of different threshold voltages of the memory cells, which are dependent on the amount of electrical charges, which are stored in the memory cell, or depending on the amount of the current flowing through the memory cell, which represents the plurality of logical states.

In an alternative embodiment of the invention the memory cells may be set up as multi bit memory cells.

In the course of this description, the understanding of a multi bit memory cell is e.g. a memory cell, which is configured to store a plurality of bits by means of spatially separated electric charge memory regions or by means of spatially separate electric conductivity domains, wherein a plurality of logical states are represented.

For an embodiment of the invention, a compromise is accomplished between a high programming speed and a high memory density in a memory cell arrangement (e.g. in a flash memory cell arrangement) with a strong memory cell to memory cell interference.

According to an embodiment of the invention, a memory cell arrangement is provided with a memory cell array e.g. with flash memory cells (e.g. in a NAND memory), wherein more than one data bit can be stored in each memory cell, wherein each arbitrary array of the memory cell array may be used as a fast write cache memory or as temporary storage device. According to an embodiment of the invention, the incoming data to be stored are (initially) stored in a mode with a storage density of less than 1 bit/memory cell. According to an embodiment of the invention, the storage density can be increased in a successive step and the data to be stored can then be stored with a higher storage density (in other words compressed) in the memory cell array.

In an embodiment of the invention, the memory cell arrangement controller provides two different programming modes, e.g. a first programming mode, wherein during programming of at least one memory cell of the plurality of memory cells, at least one memory cell which is adjacent to the memory cell to be programmed is driven to shield the at least one memory cell to be programmed, and in a second programming mode during programming of at least one memory cell of the plurality of memory cells at least one memory cell adjacent to the memory cell to be programmed is not driven to shield the memory cell to be programmed.

Expressed differently in a first programming mode not all memory cells are programmed with data, but adjacent memory cells of memory cells to be programmed are driven as shielding elements in a predefined pattern, thereby reducing the interference between the actually programmed memory cells, which enhances e.g. the programming speed. Depending on the application respectively only each second memory cell along a control line (e.g. first control line and/or second control line) may be programmed and the respectively intermediate memory cell may be used as shielding, alternatively only every third, only every forth, etc., thus e.g. in a regular alternative pattern of control. Alternatively, an arbitrary other control pattern may be used in accordance with the respective architecture of the memory cell array 300 and of the memory cell type to be programmed and the memory cells used for shielding.

In a second programming mode during programming of at least one memory cell of the plurality of memory cells it may be provided, that none of the memory cells adjacent to the memory cells to be programmed are driven to shield the memory cells to be programmed.

Thus, for an embodiment of the invention, a fast storing in a high density memory cell array is facilitated.

In an embodiment of the invention, it is provided that in a second programming mode there is no restriction in respect to the usability of memory cells 308 any more and all memory cells 308 may be programmed, even those memory cells 308, which are driven as shielding elements in the first programming mode.

In an embodiment is the at least one memory cell to be programmed electrically coupled to the first control line and the at least one memory cell, which is adjacent to the memory cell to be programmed, is coupled to a second control line, which is at least partially arranged adjacent to the first control line. Further, a control terminal (e.g. the gate terminal) of the at least one memory cell to be programmed may be electrically coupled to the first control line, which in this case may be a first word line, and a control terminal of the at least one memory cell, which is placed adjacent to the memory cell to be programmed may be electrically coupled to the second control line (e.g. a second word line, directly adjacent to the first word line). For this example the insight was utilized, that the second coupling capacity Cy may take a relatively high value and by this the respective access of e.g. only every second word line to program the memory cells in the first programming mode results in a relative big influence to the reduction of the interference between the memory cells 308 in the memory cell array 300. Thus, by using a relative simple measure a very efficient and fast programming of the memory cell array 300 in a first programming mode is achieved. Thus, descriptively, the respectively memory cells 308, which e.g. are all coupled with the first word line(s), are programmed, and those memory cells 308, which e.g. are coupled with the respectively direct adjacent arranged word lines (e.g. the second word lines), will be driven as shielding, e.g. de-activated. In an embodiment of the invention, the shielding is achieved, by driving the memory cell (e.g. by means of the respective control terminal) to be used as shield to a predefined electrical potential (which in an alternative embodiment may be variable depending on the respective programming scheme).

The memory cell arrangement control 122 may e.g. be configured such that for shielding of the at least one memory cell to be programmed an electric potential of essentially zero volt is applied, or alternatively, an electric potential with a polarity opposite to the electric potential used to program the at least one memory cell to be programmed is applied to the at least one memory cell (or e.g. all memory cells, which are coupled to the adjacent word line), which is adjacent to the memory cell to be programmed.

Figure 5:
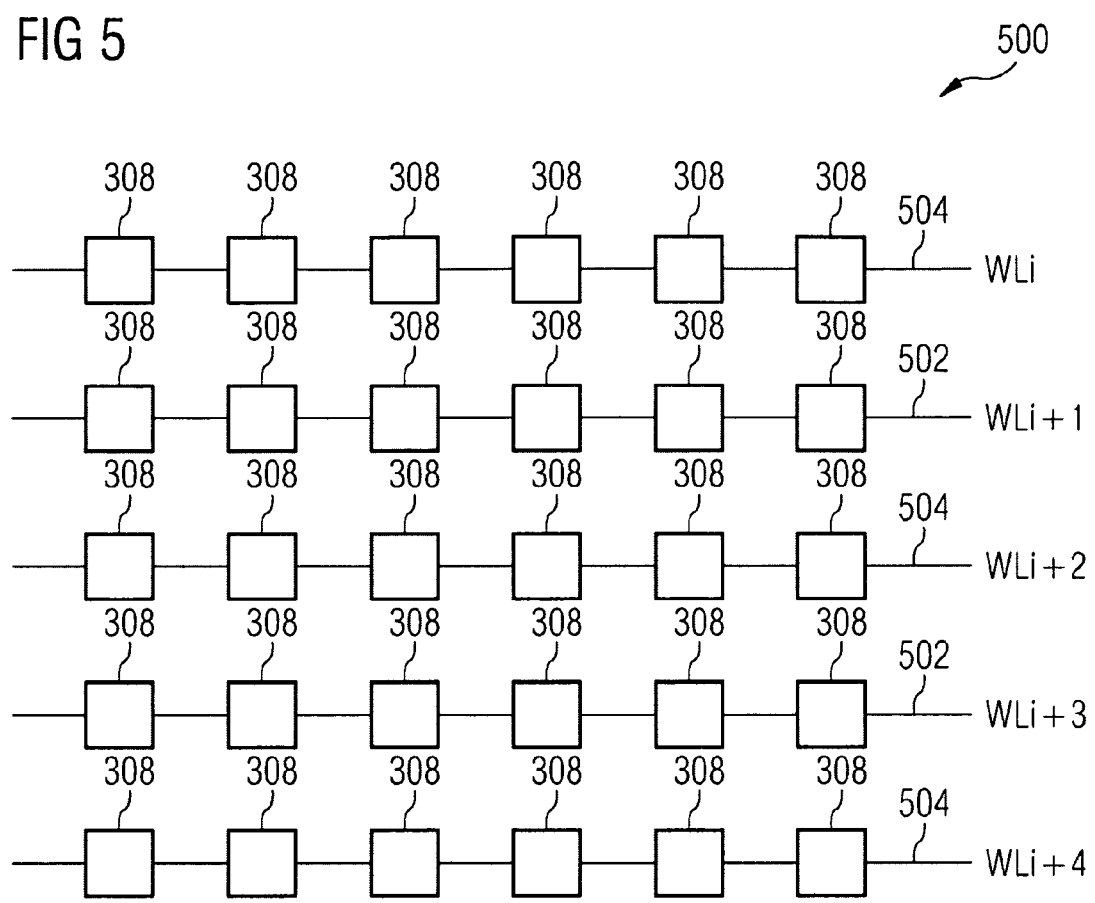
FIG. 5 shows a cutout of the memory cell arrangement of FIG. 3 according to an embodiment of the invention, wherein a shielding of programmed memory cells using adjacent word-lines is shown.

FIG. 5 shows a cutaway 500 of the memory cell arrangement 300 of FIG. 3 according to an embodiment of the invention, wherein a shielding of programmed memory cells by means of adjacent word lines is shown. In FIG. 5 the word lines, which coupled memory cells 308 are activated for programming in the first programming mode, are labeled by reference sign 502 (in FIG. 5 the word lines WLi+1 and WLi+3). The word lines, which coupled memory cells 308 are deactivated for programming in the first programming mode and which are driven to shield the activated memory cells to be programmed are tagged by reference sign 504 (in FIG. 5 the word lines WLi, WLi+2 and WLi+4).

In an embodiment, the memory cell arrangement controller 122 is configured such that the programming is executed according to the second programming mode, if no memory cell arrangement external program requirement is executed, explained descriptively e.g. as background operation of the memory cell arrangement 124.

E.g. in an embodiment, programming is performed with a memory density less than 1 bit/memory cell with a high speed of programming (e.g. first programming mode) and then, e.g. when there is no external memory request to be executed by the memory cell arrangement, a compression of the stored data may be performed, e.g. by reading of the stored data, which are stored according to the first programming mode, and re-writing them into the memory cell array, but using a slower programming scheme (e.g. the second programming mode).

The memory cells 308, which are driven for shielding in the first programming mode, may also be programmed in the second programming mode, such that, in the second programming mode, no shielding of memory cells 308 may be provided.

Thus, it may be provided, that the memory cell arrangement controller 122 is configured in such a way that the memory cells 308 of the memory cell array 202, according to the second programming mode, are programmed with more program voltage pulses and/or with program voltage pulses of longer duration (e.g. with less voltage) and/or with program voltage pulses of less voltage as compared to the first programming mode.

E.g. it may be provided, that the memory cell arrangement controller 122 is configured in such a way that the memory cells 308 of the memory cell array 202, according to the second programming mode, are programmed as multi level memory cells and, according to the first programming mode, are programmed as single level memory cells.

As described above, the memory cells adjacent to the programmed memory cells are used, if explained descriptively, as electrostatic shield (e.g. the memory cells, which are coupled with every second word line), such that, e.g. according to the first programming mode, programming may be carried out with a single voltage pulse applied, respectively, in spite of a high density memory cell array.

In this way, according to an embodiment of the invention, descriptively a high storage density is combined with a high speed of programming. In an embodiment, e.g. a speed of programming of the first program mode of about 20 Mbyte/s or higher may be achieved.

In another embodiment of the invention, a memory cell arrangement controller 122 is configured such that programming according to the second programming mode is performed if a predefined criterion is fulfilled.

The predefined criterion may be a default filling level of the memory cell array 202.

Descriptively, according to this example, the programming is carried out in accordance to the first programming mode (e.g. fast programming of the memory cells 308) until a predefined amount of memory cells 308 of the memory cell array 202 are programmed, and then, the programming is carried out according to the second programming mode (e.g. slower programming with higher storage density of the memory cells 308). Descriptively, a stepwise filling of the memory is carried out at different speeds of programming and with different storage densities (first, at higher speed of programming, with increasing filling level, when indicated, at less speed of programming but with higher storage density).

In this embodiment, the memory cell arrangement controller may be configured such that the programming according to the second programming mode is carried out, if the filling level of the memory cell array is higher than the default filling level. Furthermore, the memory cell arrangement controller may be configured such that the memory cells of the memory cell array are programmed according to the second programming mode in a higher storage density as according to the first programming mode.

In an embodiment of the invention, a more narrow distribution of the erase threshold voltage may be achieved by using the second programming mode.

Alternatively, the predefined criterion may be that there was no access to a stored file programmed according to the first programming mode during a predefined period of time.

Alternatively, the predefined criterion may be that a user activates the second programming mode manually.

In an alternative embodiment, the respective activated control lines and the control lines driven as shield, respectively, may be interchanged so that—descriptively a wear leveling may be implemented, because statistically, all control lines are activated one time and deactivated one time (driven as shield).

Figure 6:
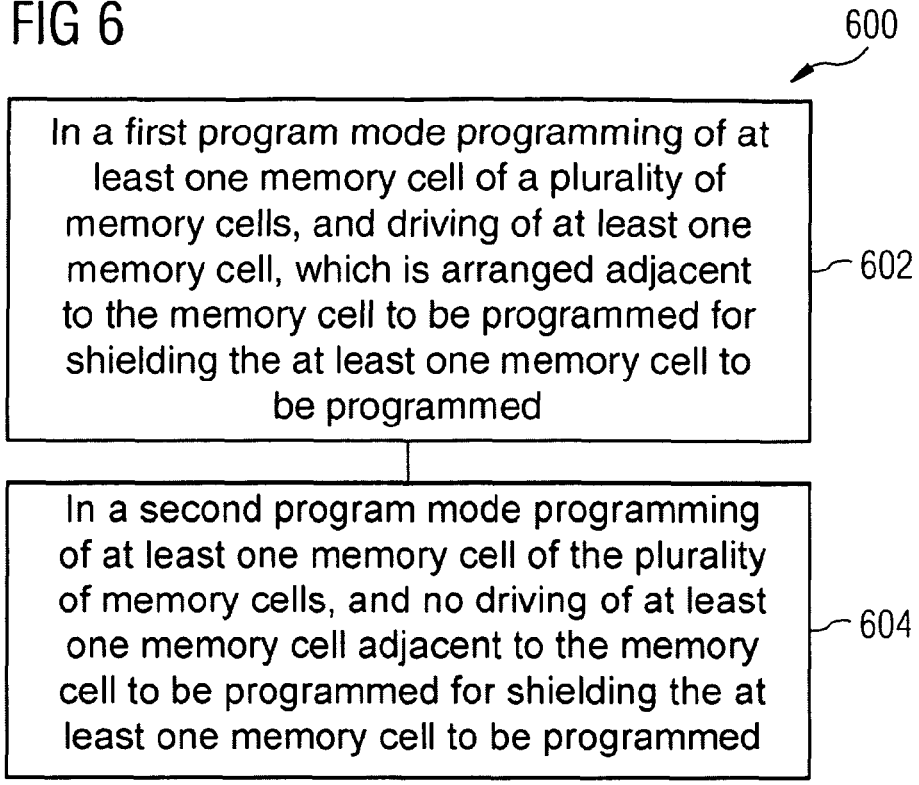
FIG. 6 shows a flow diagram illustrating a method for programming a memory cell arrangement of an integrated circuit according to an embodiment of the invention.

FIG. 6 shows a process flow 600, depicting a method to program a memory cell arrangement of an integrated circuit according to an embodiment of the invention.

In 602, in a first programming mode, at least one memory cell of the plurality of memory cells is programmed, and at least one memory cell, which is adjacent to the memory cell to be programmed, is driven to shield the at least one of the memory cells to be programmed.

In 604, in a second programming mode, at least one memory cell of the plurality of memory cells is programmed, and at least one memory cell, which is adjacent to the memory cell to be programmed, is not driven to shield the memory cell to be programmed. In other words, in 604, the at least one memory cell, which is arranged adjacent to the memory cell to be programmed, is not driven as shielding of the memory cell to be programmed (this includes a kind of control of the at least one memory cell, which is different from controlling a memory cell in the first program mode, wherein the memory cells to be programmed are electrically shielded by means of at leas one memory cell).

Figure 7A:
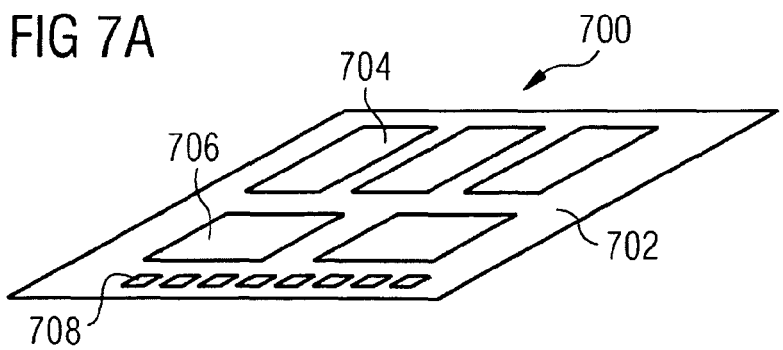
FIGS. 7A and 7B show a memory module (FIG. 7A) and a stackable memory module (FIG. 7B) according to an embodiment of the invention.
Figure 7B:
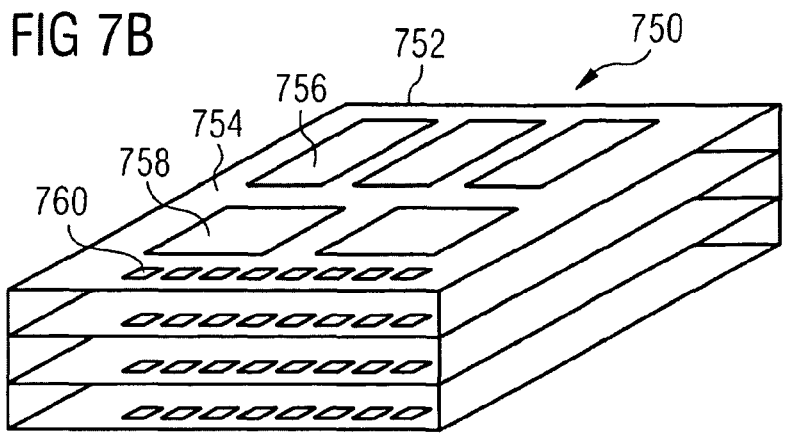

As shown in FIG. 7A and FIG. 7B, in some embodiments, memory arrangements as the ones described herein may be used in modules.

In FIG. 7A, a memory module 700 is shown, wherein one or multiple memory arrangements 704 are arranged on one substrate 702. The memory arrangement 704 may have a plurality of memory cells, wherein each memory cell is using a storage element according to an embodiment of the invention. The memory module 700 may further have one or multiple electronic arrangements 706, which include one or several memories, one or several processing circuitries, one or several control circuitries, one or more addressing circuitries, one or more bus connecting circuitries, or one or more other circuitries or electronic arrangements, which may be combined with a memory arrangement, as e.g. the memory arrangement 704, on a module. Additionally, the memory module 700 may have several electrical connections 708, which may be used for connecting the memory module 700 with other electronic components including other modules.

As shown in FIG. 7B, in some embodiments these modules may be stackable, such that a stack 750 may be formed. E.g., a stackable memory module 752 may include one or several memory arrangements 756, which are arranged on a stackable substrate 754. The memory arrangement 756 includes memory cells using memory elements according to an embodiment of the invention. Further, the stackable memory module 752 may include one or several electronic arrangements 756, which may include one or several memories, one or several processing circuitries, one or several control circuitries, one or several address circuitries, one or several bus connection circuitries, or one or several other circuitries or electronic arrangements, which may be combined with a memory arrangement on a module, as e.g. the memory arrangement 756. Electronic connections 760 are provided to couple the stackable memory module 752 with other modules in the stack 750, or with other electronic arrangements. Other modules of the stack 750 may include additional stackable memory modules, which may be formed similarly to the stackable memory module 752, which has been described above, or by other kinds of stackable modules, as e.g. stackable processing modules, stackable control modules, stackable communication modules or other modules, which include electronic components.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit comprising a memory-cell-arrangement, wherein the memory-cell-arrangement comprises:
   a memory-cell-array with a plurality of memory-cells; and
   a memory cell arrangement controller, which is configured such that in a first programming mode during programming of at least one memory cell of the plurality of memory cells, at least one memory cell, which is arranged adjacent to the memory cell to be programmed, is driven to shield the memory cell to be programmed, and
   in a second programming mode during programming of the at least one memory cell of the plurality of memory cells, the at least one memory cell, which is adjacent to the memory cell to be programmed, is not driven to shield the memory cell to be programmed.

2. The integrated circuit of claim 1,
   wherein in the second programming mode during programming of at least one memory cell of the plurality of memory cells, during programming none of memory cells arranged adjacent to the memory cells to be programmed is driven to shield the memory cells to be programmed.

3. The integrated circuit of claim 1,
   wherein the at least one memory cell to be programmed may be coupled to a first control line; and
   wherein the at least one memory cell, which is arranged adjacent to the memory cell to be programmed, is coupled to a second control line, which is arranged at least partially adjacent to the first control line.

4. The integrated circuit of claim 3,
   wherein a control-terminal of the at least one memory cell to be programmed is electrically coupled to the first control-line; and
   wherein a control terminal of the at least one memory cell, which is arranged adjacent to the memory cell to be programmed, is electrically coupled to the second control line.

5. The integrated circuit of claim 4,
   wherein the first control line is a first word line; and
   wherein the second control line is a second word line, which is arranged adjacent to the first word line.

6. The integrated circuit of claim 1,
wherein the memory cells in the memory cell array are arranged in at least one configuration of a matrix-configuration with rows and columns, and a zigzag configuration.

7. The integrated circuit of claim 1,
wherein the memory cells are non volatile memory cells.

8. The integrated circuit of claim 7,
wherein the non volatile memory cells are memory cells selected from the group of memory cells consisting of:
ferroelectric random access memory cells;
magneto-resistive random access memory cells;
phase change random access memory cells;
chalcogenide random access memory cells;
conductive bridging random access memory cells;
organic random access memory cells; and
nano-tube random access memory cells.

9. The integrated circuit of claim 1,
wherein the memory cells are resistive memory cells.

10. The integrated circuit of claim 1,
wherein the memory cells are electrically erasable programmable read only memory cells.

11. The integrated circuit of claim 10,
wherein the memory cells are flash memory cells.

12. The integrated circuit of claim 11,
wherein the memory cells are charge storing memory cells.

13. The integrated circuit of claim 12,
wherein the memory cells are selected from the group of charge storing memory cells consisting of floating gate memory cells and charge trapping memory cells.

14. The integrated circuit of claim 1,
wherein the memory cell arrangement controller is configured in such a way that for the shielding of the at least one memory cell to be programmed an electrical potential is provided to the memory cell, which is arranged adjacent to the memory cell to be programmed.

15. The integrated circuit of claim 14,
wherein the memory cell arrangement controller is configured in such a way that for the shielding of the at least one memory cell to be programmed an electrical potential, which is essentially zero volt, is provided to the memory cell, which is arranged adjacent to the memory cell to be programmed.

16. The integrated circuit of claim 14,
wherein the memory cell arrangement controller is configured in such a way that for the shielding of the at least one memory cell to be programmed an electrical potential, whose polarity is opposite to the potential used to program the at least one memory cell to be programmed, is provided to the memory cell, which is arranged adjacent to the memory cell to be programmed.

17. The integrated circuit of claim 3, further comprising:
at least one additional memory cell, which is arranged adjacent to the memory cell to be programmed; wherein
the at least one additional memory cell is electrically coupled to a third control line, which is at least partially arranged adjacent to the first control line and at least partially arranged on the opposite side of the first control line in respect to the second control line; wherein
the memory cell arrangement controller is configured such that the at least one additional memory cell is driven for shielding of the at least one memory cell to be programmed.

18. The integrated circuit of claim 1,
wherein the memory cell arrangement controller is configured such, that the programming in the second programming mode is carried out when no external program request is executed by the memory cell arrangement.

19. The integrated circuit of claim 1,
wherein the memory cell arrangement controller is configured such that the programming in the second programming mode is executed if a pre-defined criterion is fulfilled.

20. The integrated circuit of claim 19,
wherein the prior defined criterion is a default filling level of the memory cell array; and
wherein the memory cell arrangement controller is configured such that the programming according to the second programming mode is carried out if the filling level of the memory cell array is higher than a pre-defined filling level.

21. The integrated circuit of claim 1,
wherein the memory cell arrangement controller is configured such that the memory cells of the memory cell array are programmed according to the second programming mode with a higher memory storage density as programmed according to the first programming mode.

22. The integrated circuit of claim 1,
wherein the memory cell arrangement controller is configured such that the memory cells of the memory cell array according to the second programming mode are programmed with more program-voltage-pulses and with program-voltage-pulses with less voltage as according to the first programming mode.

23. The integrated circuit of claim 1,
wherein the memory cell arrangement controller is configured such that the memory cells of the memory cell array according to the second programming mode are programmed with more program-voltage-pulses and with program-voltage-pulses of shorter duration as according to the first programming mode.

24. The integrated circuit of claim 1,
wherein the memory cell arrangement controller is configured such that the memory cells of the memory cell array according to the second programming mode are programmed with program-voltage-pulses of longer duration and with program-voltage-pulses with less voltage as according to the first programming mode.

25. A memory module, comprising:
a plurality of integrated circuits, wherein at least one integrated circuit of the plurality of integrated circuits comprises a memory cell arrangement, wherein the memory cell arrangement comprises:
a memory cell array with a plurality of memory cells; and
a memory-cell-arrangement-controller, which is configured such that in a first programming mode during programming of at least one memory cell of the plurality of memory cells, at least one memory cell, which is arranged adjacent to the memory cell to be programmed, is driven to shield the memory cell to be programmed, and
in a second programming mode during programming of the at least one memory cell of the plurality of memory cells, the at least one memory cell, which is adjacent to the memory cell to be programmed, is not driven to shield the memory cell to be programmed.

26. The memory module of claim 25,
wherein the memory module is a stackable memory module; and
wherein at least some of the integrated circuits are arranged stacked on top of each other.

* * * * *